United States Patent [19]

Bader et al.

[11] Patent Number: 5,432,389
[45] Date of Patent: Jul. 11, 1995

[54] GAIN STAGE CIRCUIT WITH AUTOMATIC LEVEL CONTROL

[75] Inventors: Scott K. Bader, Mesa; Anthony Takeshian, Chandler, both of Ariz.

[73] Assignee: Motorola, Inc., Schaumburg, Ill.

[21] Appl. No.: 337

[22] Filed: Jan. 4, 1993

[51] Int. Cl.⁶ .............................................. G05F 1/10
[52] U.S. Cl. ................................. 327/538; 330/279; 327/306; 323/316
[58] Field of Search ............ 307/493, 529, 264, 296.6; 328/171, 172, 173, 32; 330/136, 138, 280, 284, 257, 282, 86, 279; 323/313, 316; 327/561, 306, 179, 53, 103, 538, 330, 322, 303

[56] References Cited

U.S. PATENT DOCUMENTS

| 4,234,853 | 11/1980 | Yamaguchi | 330/280 |
|---|---|---|---|
| 4,479,066 | 10/1984 | Embree | 307/493 |
| 4,513,253 | 4/1985 | Schröder | 330/86 |
| 4,878,031 | 10/1989 | Main | 330/284 |
| 5,012,139 | 4/1991 | Sasak et al. | 307/490 |
| 5,132,632 | 7/1992 | Russell et al. | 330/284 |
| 5,204,637 | 4/1993 | Trinh | 330/284 |

Primary Examiner—Timothy P. Callahan
Assistant Examiner—Dinh Le
Attorney, Agent, or Firm—Rennie William Dover

[57] ABSTRACT

A gain stage circuit having automatic level control is provided. In particular, the gain stage circuit provides an output voltage signal that is a predetermined multiple of the input voltage signal when the input voltage is less than a predetermined threshold. Moreover, the gain stage circuit provides an output voltage that is maintained at a constant predetermined level and independent of the input voltage signal for input voltages that are above a predetermined threshold. The gain stage circuit includes a rectification circuit, a variable gain stage circuit, a current switch and an operational amplifier. The current switch circuit of the present invention provides either an output current of the rectification circuit or a constant current to a reference input of the variable gain stage circuit. Moreover, the variable gain circuit includes a gain input that is coupled to receive a constant reference current.

6 Claims, 2 Drawing Sheets

GAIN STAGE CIRCUIT WITH AUTOMATIC LEVEL CONTROL

FIELD OF THE INVENTION

This invention relates to gain stages and, in particular, to gain stages for providing a constant gain for a first range of input voltages and a constant output level for a second range of input voltages.

BACKGROUND OF THE INVENTION

There exist many gain stages that will provide a constant gain of the input signal over a wide range of input voltages. These are commonly known as gain amplifiers. Moreover, there are many circuits that provide a constant output voltage level over a wide range of input voltages. These circuits are commonly called automatic level control circuits.

However, few, if any, of these circuits provide a constant gain for a first range of input voltage signals, and a constant, undistorted and unclipped output voltage level for a second range of input voltage signals.

At least one attempt that prior art has made in providing a gain stage circuit having both a fixed gain function and an automatic level control function is to monitor the output voltage of the gain stage circuit via external components such as resistors, capacitors and operational amplifiers. However, the disadvantage of this method is that by monitoring the output voltage, the output voltage level during the automatic level control mode is not stable because it is being monitored only after a change occurs. Thus, the automatic level control function does not provide a substantially constant output voltage.

Hence, there exists a need to provide a gain stage circuit for alternately providing a fixed gain for a first range of input voltage signals, and for providing a constant output voltage for a second range of input voltage signals.

DETAILED DESCRIPTION OF THE DRAWINGS

Figure 1:
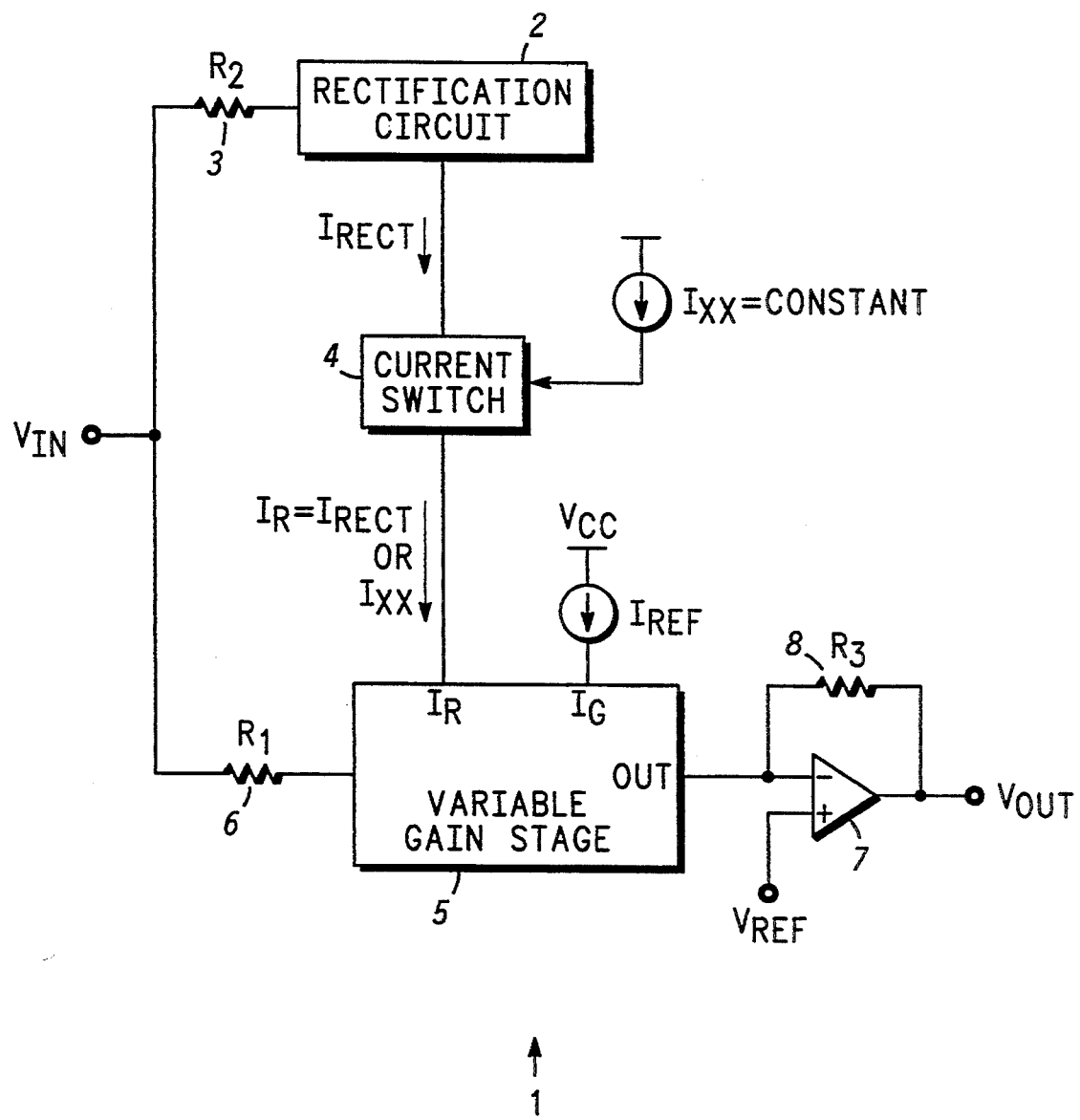
FIG. 1 is a detailed block diagram of a gain stage circuit having automatic level control in accordance with the present invention.

Referring to FIG. 1, a gain stage circuit 1 having automatic level control is shown. In particular, gain stage circuit 1 includes rectification circuit 2 having an input coupled through resistor 3 (and denoted as resistor $R_2$) to receive an input voltage ($V_{IN}$).

An output of rectification circuit 2 is coupled to a first input of current switch 4, the latter having a second input coupled to receive a constant current as denoted by current $I_{XX}$.

An output of current switch 4 is coupled to a first input (the reference $I_R$ input) of variable gain stage 5, the latter having a second input (the gain $I_G$ input) coupled to receive a reference current denoted by $I_{REF}$.

Variable gain stage 5 also includes a third input coupled through resistor 6 (and denoted as resistor $R_1$) to receive input voltage $V_{IN}$.

An output of variable gain stage 5 is coupled to an inverting input of an operational amplifier (op amp) 7, the latter having a non-inverting input coupled to receive a reference voltage, $V_{REF}$. The inverting input of op amp 7 is coupled through resistor 8 (and denoted as resistor $R_3$) to an output of op amp 7. Further, the output of op amp 7 provides output voltage $V_{OUT}$.

In operation, rectification circuit 2 receives input voltage signal $V_{IN}$, which is typically an AC voltage signal, and provides a current ($I_{RECT}$) which is essentially an averaged, rectified current signal representation of input voltage signal $V_{IN}$.

Current switch 4 functions to either pass current $I_{RECT}$ or current $I_{XX}$ to the first input of variable gain stage 5 depending upon the level of current $I_{RECT}$. In particular, if current $I_{RECT}$ is below a predetermined current level, which also means that input voltage $V_{IN}$ is below a predetermined threshold voltage, then current switch 4 passes constant current $I_{XX}$ to the first input of variable gain stage 5. On the other hand, if current $I_{RECT}$ is above a predetermined current level, which means that input voltage $V_{IN}$ is above a predetermined threshold voltage, then current switch 4 passes current $I_{RECT}$ to the first input of variable gain stage 5.

Variable gain stage 5 is a variable gain stage building block with the exception that the first input (the reference current input), which is typically coupled to receive a reference current, now receives either current $I_{XX}$ or $I_{RECT}$. Moreover, the second input of variable gain stage 5 (the gain current input), which is typically coupled to receive a variable current, now receives a reference current. The reasons for this reversal will be explained hereinafter. But for now it will suffice to say that variable gain stage 5 functions to amplify the current appearing at its third input (which is essentially $V_{IN}/R_1$) by a value substantially equal to the ratio of the current appearing at the second input of variable gain stage 5 with respect to the current appearing at the first input of variable gain stage 5.

Moreover, op amp 7 is coupled in a inverting mode thereby converting the output current of variable gain stage 5 to an output voltage as denoted by voltage $V_{OUT}$.

One can express the transfer function for gain stage circuit 1 as shown in Eqn. 1.

$$V_{OUT}/V_{IN} = [(R_3/R_1) \times (I_{REF}/I_R)] \qquad \text{EQN. 1}$$

where $I_{REF}$ is the current appearing at the second input of variable gain stage 5; and $I_R$ is the current appearing at the first input of of variable gain stage 5 which is either $I_{RECT}$ or $I_{XX}$.

The present invention realizes that if current $I_R$ is a constant current, for example, current $I_{XX}$, then voltage $V_{OUT}$ becomes a function, for example, a linear function, of input voltage $V_{IN}$ thereby obtaining a constant gain function. On the other hand, if current $I_R$ is a proportional function of input voltage $V_{IN}$, then the $V_{IN}$ terms on both sides of the equation cancel and voltage $V_{OUT}$ becomes independent of voltage $V_{IN}$ thereby achieving automatic level control. This change from a constant gain to an automatic level control can be arbitrarily set at an input threshold voltage ($V_{THRESH}$) which is determined by the values of resistors 6, 3 and 8 ($R_1$, $R_2$ and $R_3$, respectively)

For input voltage $V_{IN}$ being less than the predetermined threshold voltage, $V_{OUT}$ can be represented as a function of input voltage signal $V_{IN}$ as shown in equation 2.

$$V_{OUT} = V_{IN}[(R_3/R_1) \times (I_{REF}/I_{XX})] \quad \text{EQN. 2}$$
$$= K_1 V_{IN}, \quad V_{IN} < V_{THESH}$$

where $I_{REF}$ is the constant current supplied to the second input of variable gain stage 5;

$I_{XX}$ is the constant current supplied to the first input of variable gain stage 5 via switch 4 when current $I_{RECT}$ is less than a predetermined current level; and $K_1$ is equal to the expression $(R_3/R_1) \times (I_{REF}/I_{XX})$.

Thus, for input voltages less than a predetermined threshold, gain stage circuit 1 functions as a gain circuit whereby output voltage $V_{OUT}$ is a predetermined multiple ($K_1$) of input voltage $V_{IN}$.

However, for input voltages $V_{IN}$ being greater than the threshold voltage, output voltage $V_{OUT}$ is independent of input voltage $V_{IN}$ as shown in equation 3.

$$V_{OUT} = V_{IN}[R_3/R_1)(I_{REF} \times R_2)/K_2 V_{IN})] \quad \text{EQN. 3}$$
$$= K_3 \times I_{REF}, \quad V_{IN} > V_{THESH}$$

where $K_2$ is the gain through rectification circuit; and $K_3$ is equal to the expression $(R_2 \times R_3/R_1)(I_{REF})/K_2$.

Thus, for input voltages greater than a predetermined threshold, gain stage circuit 1 functions as an automatic control level circuit whereby output voltage $V_{OUT}$ is maintained at a constant voltage level ($K_3 \times I_{REF}$) and is independent of input voltage $V_{IN}$.

In summary, there are two important aspects of the present invention. First, the present invention utilizes a variable gain stage 5 whereby typically a constant current is sent into a first input (the $I_R$ input) and the variable current is sent into the second input (the $I_G$ input). However, the present invention reverses the inputs such that the constant current $I_{REF}$ is sent into the second input of variable gain stage 5, while the variable current (when voltage $V_{IN}$ is greater than a predetermined threshold voltage) is sent into the first input of variable gain stage 5. The significance of this reversal can be seen by referring back to equations 1 and 3. According to EQN. 1, the term $I_R$ is in the denominator. Thus, for input voltages greater than the predetermined threshold, it is desired to have current $I_R$ appear in the denominator of EQN. 1 such that when current $I_R$ is a proportional function of input voltage $V_{IN}$, output voltage $V_{OUT}$ becomes independent of the input voltage as shown in equation 3. Thus, without this reversal current $I_R$ would be in the numerator of EQN. 1 thereby making voltage $V_{OUT}$ being a function of the input voltage squared which would not result in an automatic level control function.

A second important aspect of the present invention is the use of current switch 4 which functions to pass either the current appearing at the output of rectification circuit 2 or constant current $I_{XX}$ to the first input of variable gain stage 5. Thus, current switch 4 is either passing current $I_{RECT}$ which is a function of voltage $V_{IN}$ ($I_{RECT} \times K_2/R_2$) or a constant current ($I_{XX}$) to the first input of variable gain stage 5. In particular, for input voltages less than a predetermined threshold, it is desired to make output voltage $V_{OUT}$ a predetermined factor of voltage $V_{IN}$ thereby achieving a constant gain function for input voltages less than a predetermined threshold. On the other hand, for input voltages greater than a predetermined threshold, it is desired to provide a voltage $V_{OUT}$ which is a constant and independent of voltage $V_{IN}$ thereby achieving an automatic level control circuit for input voltages greater than the predetermined threshold. Thus, it should be readily apparent that since current $I_R$ is switched between current $I_{RECT}$ and $I_{XX}$ depending upon the level of input voltage $V_{IN}$, the present invention provides both a gain stage function and an automatic level control function which is not done by monitoring the output voltage signal ($V_{OUT}$) but rather the input voltage signal ($V_{IN}$). As a result, the present invention does not suffer from the disadvantages as pointed out from the prior art from monitoring the output voltage. Moreover, the present invention does provide a substantially constant output voltage level when functioning in the automatic level control mode.

Figure 2:
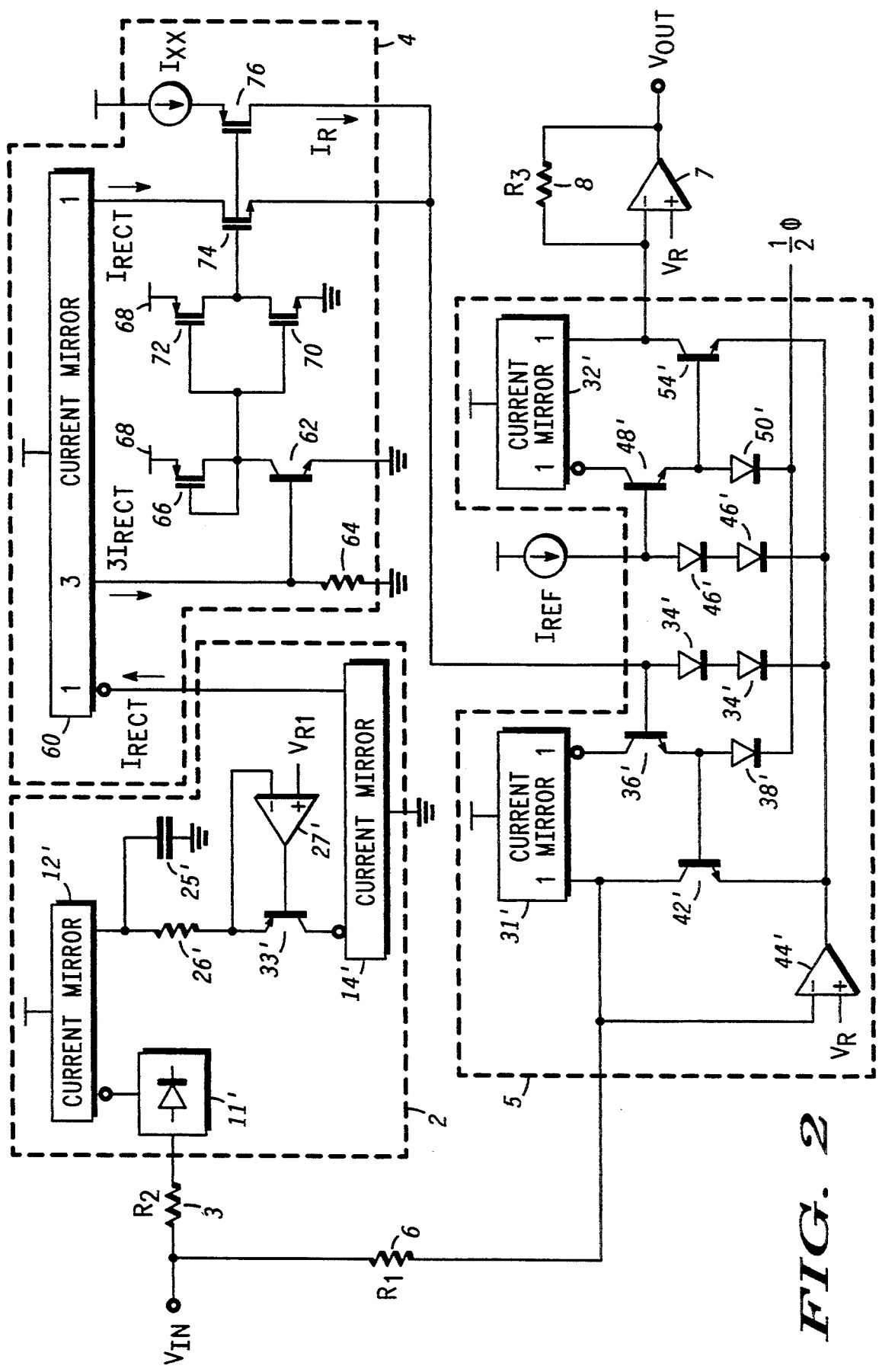
FIG. 2 is a more detailed schematic/block diagram of the gain stage circuit shown in FIG. 1.

Referring to FIG. 2, a more detailed schematic/block diagram of gain stage circuit 1 is shown. It is understood that components shown in FIG. 2 which are identical to components shown in FIG. 1 are identified by the same reference numbers. Rectification circuit 2 includes full wave rectifier 11', current mirrors 12' and 14', operational amplifier 27', transistor 33', resistor 26' and capacitor 25'. The operation of rectification circuit 2 is fully described in U.S. Pat. No. 5,012,139 the subject matter of which is incorporated by reference herein. In particular, elements shown in rectification circuit 2 of the subject invention which correspond to identical components shown in FIG. 4 of U.S. Pat. No. 5,012,139 are identified by prime numbers. Briefly, rectification circuit 2 provides for a full wave rectification of input voltage signal $V_{IN}$ which is then averaged to provide an output current as denoted by current $I_{RECT}$ as shown in FIG. 2 of the subject invention.

Variable gain stage 5 includes current mirrors 31' and 32', operational amplifier (op amp) 44', transistors 42', 36', 48' and 54', and diodes 38', 34', 46' and 50'. The operation of variable gain stage 5 is fully described in U.S. Pat. No. 4,878,031 the subject matter of which is incorporated by reference herein. In particular, the components shown in variable gain stage 5 of FIG. 2 of the subject invention which correspond to identical components shown in FIG. 2 of U.S. Pat. No. 4,878,031 are identified by prime reference numbers. Briefly, variable gain stage 5 is responsive to an input current ($I_{IN}$) which is essentially input voltage $V_{IN}$ divided by the value of resistor 6 ($V_{IN}/R_1$) and provides an output current ($I_{OUT}$) to the inverting input of operational amplifier 7 which is substantially equal to its input current multiplied by the ratio of the current $I_{REF}$ and current $I_R$. Although variable gain stage 5 is shown to provide an inverting current gain, it is understood that a non-inverting current gain may also be accomplished by reversing the inputs of op amp 44' and reversing the input and output terminals of current mirror 31'.

The circuit shown in FIG. 2 includes at least one implementation for current switch 4 wherein current switch 4 functions to alternately pass one of two input currents based upon the level of one of the input currents. Current switch 4 includes current mirror circuit 60 having an input coupled to receive output current $I_{RECT}$ from rectification circuit 2. Current mirror circuit 60 includes a first output for providing a current substantially equal to a predetermined multiple, for example, 3, of current $I_{RECT}$. The first output of current mirror 60 is coupled to a base of transistor 62 the latter having an emitter returned to ground. The base of transistor 62 is coupled through bias resistor 64 and returned to ground.

The collector of transistor 62 is coupled to the drain and gate electrodes of PMOS transistor 66 the latter having a source electrode coupled to a first supply voltage terminal as denoted by reference number 68. The collector of transistor 62 is also coupled to the gate electrodes of NMOS transistor 70 and PMOS transistor 72. The source electrode of NMOS transistor 70 is returned to ground while the source electrode of PMOS transistor 72 is coupled to the first supply voltage terminal.

The drain electrodes of transistors of 70 and 72 are coupled to one another and further coupled to the gate electrodes of both NMOS transistor 74 and PMOS transistor 76. The drain electrode of NMOS transistor 74 is coupled to a second output of current mirror 60 for receiving current $I_{RECT}$. The source electrode of PMOS transistor 76 is coupled to receive constant current $I_{XX}$. The source electrode of NMOS of transistor 74 and the drain electrode of PMOS transistor 76 are coupled together for providing current $I_R$ to the first input of variable gain stage 5.

In operation, if current $I_{RECT}$ is below a predetermined threshold which corresponds to input voltage $V_{IN}$ being below a predetermined threshold, then the current provided at the first output of current mirror 60 is not sufficient enough to create a voltage across resistor 64 to render transistor 62 operative. Therefore, the collector of transistor 62 will have a voltage indicative of a logic high appearing thereat which will also appear at the gate electrodes of transistors 74 and 76. Since the pair of transistors 70 and 72 functions as an inverter, a voltage indicative of a logic low will appear at the drain electrodes of transistors 70 and 72. As a result, PMOS transistor 76 will be rendered operative and current $I_R$ will be substantially equal to constant current $I_{XX}$. This means that current IR is not a function of input voltage $V_{IN}$ thereby making voltage $V_{OUT}$ a function of voltage $V_{IN}$ as represented in equation 2.

On the other hand, when current $I_{RECT}$ is above a predetermined threshold which corresponds to input voltage $V_{IN}$ being above a predetermined threshold, then the current provided at the first output of current mirror 60 will be sufficient to provide an adequate voltage drop across bias resistor 64 to render transistor 62 operative. This will subsequently provide a logic low voltage level at the gate electrodes of transistors 70 and 72 thereby providing a logic high voltage level at the gate electrodes of transistors 74 and 76. As a result, NMOS transistor 74 will be rendered operative thereby making current $I_R$ substantially equal to current $I_{RECT}$ which is a function of input voltage $V_{IN}$. As a result, voltage $V_{OUT}$ becomes independent of input voltage $V_{IN}$ since voltage $V_{IN}$ is included in the denominator of the expression for voltage $V_{OUT}$ as shown in equation 3.

In summary, current switch 4 is responsive to the output current of rectification circuit 2 for providing an output current that is equal to the output current of rectification circuit 2 ($I_{RECT}$) when voltage $V_{IN}$ is greater than a predetermined threshold voltage, or for providing an output current that is equal to constant current $I_{XX}$ when voltage $V_{IN}$ is below a predetermined threshold voltage.

By now it should be apparent from the foregoing discussion that a novel gain stage circuit having automatic level control is provided. In particular, the gain stage circuit provides an output voltage signal that is a predetermined multiple of the input voltage signal when the input voltage is less than a predetermined threshold. Moreover, the gain stage circuit provides an output voltage that is maintained at a constant predetermined level and independent of the input voltage signal for input voltages that are above a predetermined threshold.

The gain stage circuit includes a rectification circuit, a variable gain stage circuit, a current switch and an operational amplifier. The current switch circuit of the present invention provides either an output current of the rectification circuit or a constant current to a reference input of the variable gain stage circuit. Moreover, the variable gain circuit includes a gain input that is coupled to receive a constant reference current.

While the invention has been described in conjunction with specific embodiments thereof, it is evident that many alterations, modifications and variations will be apparent to those skilled in the art in light of the foregoing description. Accordingly, it is intended to embrace all such alterations, modifications and variations in the appended claims.

We claim:

1. A gain stage circuit having automatic level control, comprising:
   a first resistor;
   a second resistor;
   a third resistor;
   a rectification circuit having an input and an output, said input of said rectification circuit being coupled through said second resistor to receive an input voltage, said output of said rectification circuit providing a rectified current which is a function of said input voltage;
   a current switch having first and second inputs and an output, said first input of said current switch being coupled to said output of said rectification circuit, said second input of said current switch being coupled to receive a constant current, said output of said current switch providing an output current, said output current of said current switch being substantially equal to said constant current when said input voltage is below a predetermined threshold to set a gain of the gain stage circuit to a predetermined value, said output current of said current switch being substantially equal to said rectification current when said input voltage is greater than said predetermined voltage to set an output voltage of the gain stage circuit to a predetermined voltage;
   a variable gain stage having first, second and third inputs and an output, said first input of said variable gain stage being coupled to said output of said current switch, said second input of said variable gain stage being coupled to receive a reference current, said third input of said variable gain stage being coupled through said first resistor to receive said input voltage; and
   an operational amplifier having a non-inverting input, an inverting input and an output, said inverting input of said operational amplifier being coupled to said output of said variable gain stage, said non-inverting input of said operational amplifier being coupled to receive a reference voltage, said output of said operational amplifier being coupled via said third resistor to said inverting input of said operational amplifier, said output of said operational amplifier also providing an output voltage of the gain stage circuit.

2. The gain stage circuit according to claim 1 wherein said current switch includes:
- a current mirror circuit having an input and first and second outputs, said input of said first current mirror circuit being coupled to said output of said rectification circuit;
- a first transistor having a collector, a base and an emitter, said base of said first transistor being coupled to said first output of said first current mirror circuit, said emitter of said first transistor being coupled to a first supply voltage terminal;
- a second transistor having drain, control and source electrodes, said control and drain electrodes of said second transistor being coupled to said collector of said first transistor, said source electrode of said second transistor being coupled to a second supply voltage terminal;
- a third transistor having drain, control, and source electrodes, said control electrode of said third transistor being coupled to said collector of said first transistor, said source electrode of said third transistor being coupled to said first supply voltage terminal;
- a fourth transistor having drain, control and source electrodes, said control electrode of said fourth transistor being coupled to said control electrode of said third transistor, said drain electrode of said fourth transistor being coupled to said drain electrode of said third transistor, said source electrode of said fourth transistor being coupled to said second supply voltage terminal;
- a fifth transistor having drain, control and source electrodes, said drain electrode of said fifth transistor being coupled to said second output of said current mirror circuit, said control electrode of said fifth transistor being coupled to said drain electrode of said third transistor, said source electrode of said fifth transistor being coupled to said first input of said variable gain stage; and
- a sixth transistor having drain, control and source electrodes, said source electrode of said sixth transistor being coupled to receive said constant current, said control electrode of said sixth transistor being coupled to said control electrode of said fifth transistor, said drain electrode of said sixth transistor being coupled to said source electrode of said fifth transistor.

3. A method for providing a circuit for providing an output voltage signal being a multiple of an input voltage signal when the input voltage signal is less than a predetermined voltage level, and for providing a constant output voltage independent of the input voltage signal when the input voltage signal is greater than a predetermined voltage level, the circuit including a variable gain stage having a gain input and a reference input, the variable gain stage also including an input coupled to receive the input voltage signal and an output coupled to provide the output voltage signal, the method comprising the steps of:
- providing a reference current to the gain input of the variable gain stage; and
- alternately providing first and second currents to the reference input of the variable gain stage, said first current being a constant current and supplied to the reference input of the variable gain stage when the input voltage signal is less than a predetermined voltage, said second current being a function of the input voltage signal and being supplied to the reference input of the variable gain stage when the input voltage signal is greater than said predetermined voltage.

4. A gain stage circuit having automatic level control, comprising:
- first means for providing an output current which is a function of an input voltage signal, said first means having an input and an output, said input of said first means being coupled to receive said input voltage signal, said output of said first means providing said output current;
- second means for alternately providing said output current of said first means or a constant current at an output of said second means, said second means having first and second inputs, said first input of said second means being coupled to said output of said first means, said second input of said second means being coupled to receive said constant current, said output of said second means providing a current substantially equal to said constant current when said input voltage signal is below a predetermined voltage level, said output current of said second means providing a current substantially equal to said output current of said first means when said input voltage signal is greater than said predetermined voltage level;
- third means for providing a variable gain, said third means having first, second and third inputs and an output, said first input of said third means being coupled to said output of said second means, said second input of said third means being coupled to receive a reference current, said third input of said third means being coupled through to receive said input voltage signal; said output of said third means providing a current that is substantially equal to the product of a current appearing at said third input of said third means and the ratio of said currents appearing at said second and first inputs of said third means; and
- fourth means for converting said current appearing at said output of third means to an output voltage signal.

5. A gain stage circuit having automatic level control, comprising:
- first means for providing an output current which is a function of an input voltage signal, said first means having an input and an output, said input of said first means being coupled to receive said input voltage signal, said output of said first means providing said output current; second means for alternately providing said output current of said first means or a constant current at an output of said second means, said second means having first and second inputs, said first input of said second means being coupled to said output of said first means, said second input of said second means being coupled to receive said constant current, said output of said second means providing a current substantially equal to said constant current when said input voltage signal is below a predetermined voltage level, said output current of said
- second means providing a current substantially equal to said output current of said first means when said input voltage signal is greater than said predetermined voltage level wherein said second means includes:
  - a current mirror circuit having an input and first and second outputs, said input of said first current mirror circuit being coupled to said output of said first means;

a first transistor having a collector, a base and an emitter, said base of said first transistor being coupled to said first output of said first current mirror circuit, said emitter of said first transistor being coupled to a first supply voltage terminal;

a second transistor having drain, control and source electrodes, said control and drain electrodes of said second transistor being coupled to said collector of said first transistor, said source electrode of said second transistor being coupled to a second supply voltage terminal;

a third transistor having drain, control, and source electrodes, said control electrode of said third transistor being coupled to said collector of said first transistor, said source electrode of said third transistor being coupled to said first supply voltage terminal;

a fourth transistor having drain, control and source electrodes, said control electrode of said fourth transistor being coupled to said control electrode of said third transistor, said drain electrode of said fourth transistor being coupled to said drain electrode of said third transistor, said source electrode of said fourth transistor being coupled to said second supply voltage terminal;

a fifth transistor having drain, control and source electrodes, said drain electrode of said fifth transistor being coupled to said second output of said current mirror circuit, said control electrode of said fifth transistor being coupled to said drain electrode of said third transistor, said source electrode of said fifth transistor being coupled to said first input of said third means; and a sixth transistor having drain, control and source electrodes, said source electrode of said sixth transistor being coupled to receive said constant current, said control electrode of said sixth transistor being coupled to said control electrode of said fifth transistor, said drain electrode of said sixth transistor being coupled to said source electrode of said fifth transistor;

third means for providing a variable gain, said third means having first, second and third inputs and an output, said first input of said third means being coupled to said output of said second means, said second input of said third means being coupled to receive a reference current, said third input of said third means being coupled through to receive said input voltage signal; said output of said third means providing a current that is substantially equal to the product of a current appearing at said third input of said third means and the ratio of said currents appearing at said second and first inputs of said third means; and fourth means for converting said current appearing at said output of third means to an output voltage signal.

6. The gain stage circuit according to claim 4 wherein said fourth means includes an operational amplifier having a non-inverting input, an inverting input and an output, said inverting input of said operational amplifier being coupled to said output of said third means, said non-inverting input of said operational amplifier being coupled to receive a reference voltage, said output of said operational amplifier being coupled through a resistor to said inverting input of said operational amplifier, said output of said operational amplifier providing said output voltage signal.

* * * * *